United States Patent [19]

Schwalke et al.

[11] Patent Number: 5,268,317
[45] Date of Patent: Dec. 7, 1993

[54] METHOD OF FORMING SHALLOW JUNCTIONS IN FIELD EFFECT TRANSISTORS

[75] Inventors: Udo Schwalke, Williston, Vt.; Christoph Zeller, Fishkill, N.Y.; Heinrich J. Zeininger, Essex Junction; Wilfried Hänsch, Charlotte, both of Vt.

[73] Assignee: Siemens Aktiengesellschaft, Berlin and Munich, Fed. Rep. of Germany

[21] Appl. No.: 790,953

[22] Filed: Nov. 12, 1991

[51] Int. Cl.$^5$ .................. H01L 21/265; H01L 21/44
[52] U.S. Cl. ...................... 437/41; 437/160; 437/29; 437/200; 437/950
[58] Field of Search .............. 437/41, 192, 198, 200, 437/24, 29, 154, 160, 931, 956, 951, 958, 969; 357/23.9, 23.3

[56] References Cited

U.S. PATENT DOCUMENTS

| | | | |
|---|---|---|---|
| 4,558,507 | 12/1985 | Okabayashi et al. | 437/29 |
| 4,622,735 | 11/1986 | Shibita | 437/200 |
| 4,683,645 | 8/1987 | Naguib et al. | 437/24 |
| 4,717,684 | 1/1988 | Kaffo et al. | 437/200 |
| 4,761,384 | 8/1988 | Neppl et al. | 437/29 |
| 4,764,478 | 8/1988 | Hiruta | 437/29 |
| 4,774,204 | 9/1988 | Havemann | 437/200 |
| 4,788,160 | 11/1988 | Havemann et al. | 437/200 |
| 4,816,423 | 3/1989 | Havemann | 437/31 |
| 4,835,112 | 5/1989 | Pfiester et al. | 437/24 |
| 4,843,023 | 6/1989 | Chiu et al. | 437/34 |
| 4,889,820 | 12/1989 | Mori | 437/29 |
| 4,900,688 | 2/1990 | Halvis | 437/29 |
| 4,912,053 | 3/1990 | Schrantz | 437/29 |
| 4,914,500 | 4/1990 | Liu et al. | 357/23.3 |
| 4,922,311 | 5/1990 | Lee et al. | 357/23.9 |
| 5,028,554 | 7/1991 | Kita | 437/200 |

FOREIGN PATENT DOCUMENTS

| | | | |
|---|---|---|---|
| 63-313818 | 12/1988 | Japan | 437/200 |
| 0324733 | 2/1991 | Japan | 437/950 |

OTHER PUBLICATIONS

"Leakage Mechanisms in Ultra-Shallow Silicided Source/Drain Junctions of Deep Submicron MOSFETs", Schwalke et al., sent Apr. 11, 1991 for consideration for presentation at the 1991 International Conference on Solid-State Devices and Materials, Yokohama, Japan, Aug. 27-29, 1991.

"Modified Schottky Behavior in Shallow p+—n Junctions Formed by Outdiffusion from Cobalt Silicide", Lebowitz et al., IEEE Transactions on Electron Devices, vol. ED-34, No. 11, Nov. 1987, pp. 2366.

"Formation of Silicided, Ultra-Shallow Junctions Using Low Thermal Budget Processing", C. M. Osburn, Journal of Elec. Materials, vol. 19, 1990, pp. 67-88.

"Thermal Budget Issues for Manufacturing Deep Submicron ULSI", Fair et al., Technical Report TR89-61, Dec. 12, 1989.

*Primary Examiner*—Olik Chaudhuri
*Assistant Examiner*—Ramamohan R. Paladugu
*Attorney, Agent, or Firm*—Adel A. Ahmed

[57] ABSTRACT

A method of making a MOS field effect transistor having shallow source and drain regions with improved breakdown and leakage characteristics includes the step of forming a layer of a metal silicide along a surface of a body of silicon at each side of a gate which is on an insulated from the surface. A high concentration of an impurity of a desired conductivity type is implanted only into the metal silicide layers. A lower concentration of the impurity is then implanted through the metal silicide layers and into the body just beneath the metal silicide layers. The body is then annealed at a temperature which drives the impurities from the metal silicide layer into the body to form the junctions.

28 Claims, 3 Drawing Sheets

METHOD OF FORMING SHALLOW JUNCTIONS IN FIELD EFFECT TRANSISTORS

FIELD OF THE INVENTION

The present invention relates to a method of forming shallow junctions field effect transistors, and more particularly, to a method of forming shallow junctions which have improved leakage and breakdown characteristics.

BACKGROUND OF THE INVENTION

In making sub-micron metal-oxide-semiconductor field effect transistors (MOSFETs), it is desirable to provide the transistor with ultra shallow (depths of less than 150 nm) source/drain regions (junctions). The shallow junctions have lower sheet and contact resistance at low leakage currents. Silicided shallow junctions have been found to lower both metal-to-diffusion resistance as well as diffusion sheet resistance and, because of the low dose required, they have the potential to reduce substrate damage associated with ion implantation. Heretofore, shallow silicided junctions have been formed by forming along a surface of a substrate of single crystalline silicon a layer of a metal silicide, such as a silicide of cobalt, titanium tungsten, tantalum or molybdenum. The silicide layer is doped with a desired conductivity impurity by ion implantation. The device is then heated to diffuse the dopant from the silicide into the substrate to form a shallow junction. This process is described in U.S. Pat. No. 4,788,160 (R. H. Havemann et al., issued Nov. 29, 1988) and U.S. Pat. No. 4,816,423 (Havemann, issued Mar. 28, 1989). A low implantation energy of a high dose implant (typically $5 \times 10^{15}$ impurities/cm$^2$) is used to confine the implantation of the dopant entirely to the silicide. Since the dopant is then diffused into the substrate, there is no implantation damage to the substrate which must otherwise be annealed out.

However, despite the absence of implantation damage in the substrate, the leakage and breakdown characteristics of outdiffused junctions are often not satisfactory. This is especially true when the process is used in conjunction with low thermal processing. For example, insufficient outdiffusion from the silicide in conjunction with a rough silicide/silicon substrate interface can cause silicide spiking. This results in the formation of Schottky diodes which degrade the junction leakage. In addition, at high doping levels and extreme shallow junction depths, the risk of soft breakdown via tunneling also increases.

One known technique which has been attempted to overcome some of these problems is to increase the thermal cycle so as to promote the outdiffusion. However, the silicide must be thermally stable for the anneal cycle required to drive the dopant into the silicon from the silicide. Quite often the silicide agglomerates, thereby causing the interface roughness to increase. This promotes the silicide spiking, which is undesirable. Also, other processing constraints and the device design may limit the thermal cycle which can be used.

Another known technique is the implantation of the dopant tail through the silicide into the silicon. This technique reduces the amount of dopant that must be supplied by outdiffusion from the silicide in order to form a good junction. However, it has been found to be very difficult to control this technique since the implantation tail is very sensitive to variations in silicide thickness. Also, it is very dependent on silicide morphology due to channeling. Another disadvantage of this technique is that the concentration of the implantation peak and implantation tail are not independent of each other. Thus, the amount of dopant needed for outdiffusion from the silicide (i.e., the implantation peak) and the amount of dopant at the silicide/silicon substrate interface (i.e., the implantation tail) cannot be optimized independently.

Still another known technique is to have the implantation peak near the silicide/silicon substrate interface. This technique maximizes the ion-beam mixing effect which results in a spiking. However, considerable metal knock-on into the silicon substrate from the metal silicide as well as crystal damage at the junction are the drawbacks of this technique. Also, the junctions are fairly deep because of the struggle created at the implantation conditions and the extended annealing required to remove damage. This limits this technique to relatively deep junctions (greater than 150 nm).

A further known technique is to deep implant through the silicide. In this technique the full dose of the dopant is implanted at a high energy through the silicide into the silicon. This technique is thereby restricted to deep junctions only and, like any high-dose implant, it generates severe crystal damage in the substrate. Also, extensive annealing is required to remove the implantation damage.

SUMMARY OF THE INVENTION

The present invention relates to a method of making shallow junctions in a body (substrate) of single crystalline silicon of a first conductivity type by diffusion from a metal silicide which provides improved junction characteristics. This is achieved by a method wherein a layer of a metal silicide is formed along a surface of a silicon body. The metal silicide layer is doped with an impurity of a second type which is opposite the first conductivity type. Ions of the impurity of the second conductivity type are then embedded into the body through the metal silicide layer. Then, the impurities in the silicide layer are diffused from the silicide layer into the silicon body to form the junction.

Viewed from another aspect, the present invention is directed to a method of making a field effect transistor having shallow source and drain regions. The method comprises the steps of forming on the surface of a body of single crystalline silicon of a first conductivity type a conductive gate which is insulated from the surface; forming along the surface of the body at each side of the gate a layer of a metal silicide; doping the metal silicide layers with an impurity of a second conductivity type which is opposite that of the first conductivity type; embedding through the metal silicide layer and into the body ions of the impurity of the second conductivity type; and then diffusing the impurities from the metal silicide layers into the body to form the source and drain regions.

The invention will be better understood from the following more detailed description taken with the accompanying drawings.

The drawings are not necessarily drawn to scale.

DETAILED DESCRIPTION

Figure 1:
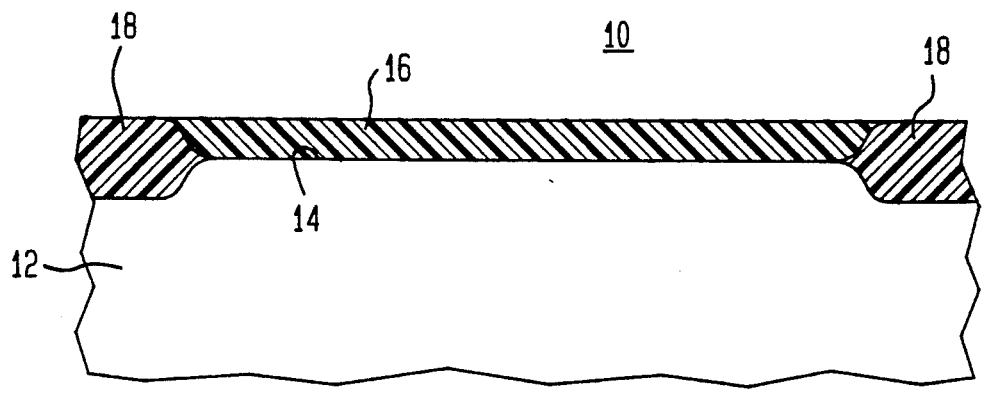
FIGS. 1 through 5 are cross-sectional views of an MOS field effect transistor in various stages of being formed which illustrates the various steps of the method of the present invention.

Referring now to FIG. 1, there is shown a cross-sectional view of a starting structure of a metal-oxide-semiconductor (MOS) field effect transistor (FET) 10 (also known as a MOSFET) to be formed with shallow junctions (i.e., for the source and drain regions) in accordance with a method of the present invention. The transistor 10 starts with a body (substrate) 12 of single crystalline silicon with a typical impurity concentration of about $1 \times 10^{16}$ impurities/cm$^3$ and having a surface 14. For an n-channel MOSFET 10 (also denoted as an insulated gate field effect transistor (IGFET)), the body 12 is of p-type conductivity and the source and drain regions are of n-type conductivity. On the surface 14 is a masking layer 16 which covers the portion of the surface 14 where the transistor 10 is to be formed. The masking layer 16 is generally of silicon nitride, either alone or over a layer of silicon dioxide. Spaced apart isolation regions 18 of silicon dioxide are formed at the surface 14 at each side of the masking layer 16. The isolation regions are formed by heating the body 12 in an oxidizing atmosphere to form the silicon dioxide.

Figure 2:
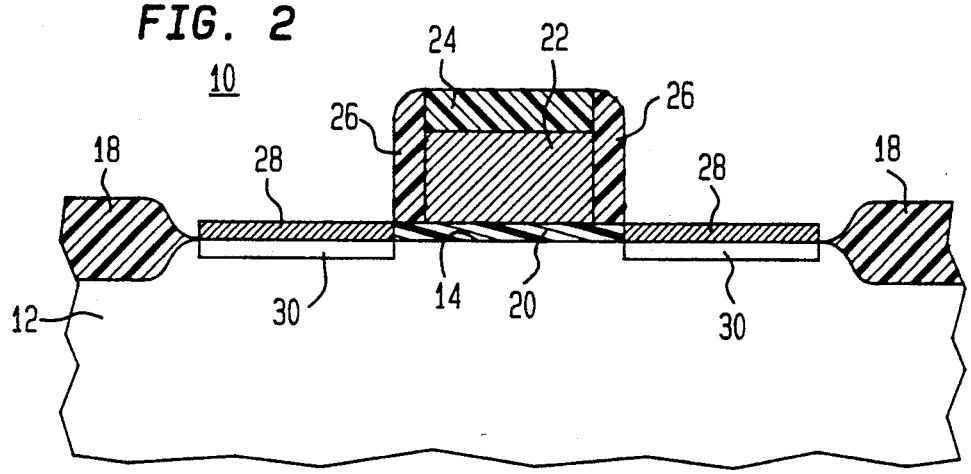

Referring now to FIG. 2, there is shown a cross-sectional view of the transistor 10 illustrating the next steps of making the transistor 10. The masking layer 16 is removed with a suitable etchant. Then the body 12 is heated in an oxidizing atmosphere to form a thin gate dielectric layer 20 of silicon dioxide on the surface 14 between the isolation regions 18. A gate 22 of doped polysilicon is then formed on the gate dielectric layer 20 over a portion of the surface 14 between the isolation regions 18. The gate 22 is formed by depositing a layer of polysilicon over the entire surface of the gate dielectric layer 20 and the isolation regions 18 and doping the polysilicon layer with an impurity of the desired conductivity type, such as phosphorous for n-type conductivity. A masking layer 24 of either silicon dioxide, silicon nitride or a combination of the two, is then formed over the portion of the polysilicon layer which is to form the gate 22. The remaining portion of the polysilicon layer is then removed with a suitable etchant leaving the gate 22.

Sidewall spacers 26 of either silicon dioxide or silicon nitride may then be formed along the sides of the gate 20. This is achieved by depositing a layer of the material over the gate 22 and the gate dielectric layer 20 on each side of the gate 22. The layer is then etched by an anisotropic etch which etches substantially perpendicular to the surface 14 of the body 12. This removes all of the layer except the sidewall spacers 26. Also, the portions of the gate dielectric layer 20 on the body surface 14 at each side of the gate 22 are removed by etching to expose the surface 14.

A layer 28 of a suitable metal, such as cobalt, titanium, tungsten, tantalum, or molybdenum, is then deposited on the exposed body surface 14 between the sidewall spacers 26 and the isolation regions 18. This may be achieved by selective deposition or by coating the metal over the entire device and removing the metal from over the gate 22 and isolation regions 18 by photolithography and etching. The device is then heated at a suitable temperature, about 700°-800° C., depending on the metal used, to react the metal layer 28 with the silicon of the body 12 to form a metal silicide layer 30 along the body surface 14 between the sidewall spacers 26 and the isolation regions 18. The heating step is carried out for a time period, about 30 seconds more or less, depending on the metal used, to form a metal silicide layer 30 which is of a thickness of about 50 nm. If desired, any excess metal of the metal layer 28 may be removed with a suitable etchant. However, by leaving such excess metal on the metal silicide layer 30 there is provided a good contact to the metal silicide layer 30.

Figure 3:
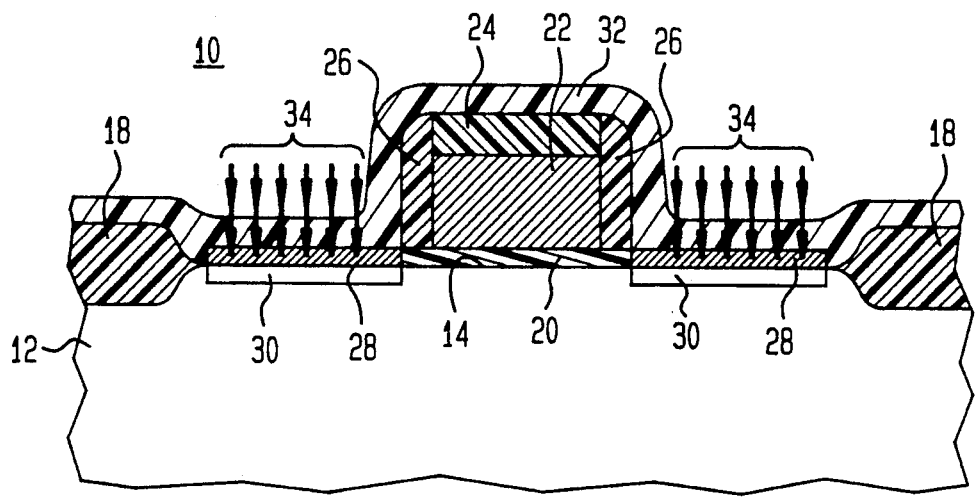

Referring now to FIG. 3, there is shown a cross-sectional view of the transistor 10 during the next steps of the method of the present invention. A thin capping layer 32 of either silicon dioxide or silicon nitride is then deposited over the isolation regions 18, the metal silicide layers 30 and the gate 22. The metal silicide layers 30 are then doped with a high concentration of an impurity of the desired conductivity type for there to be formed source and drain regions of the transistor 10. As indicated by the arrows 34, this is achieved by ion implantation. The ion implantation is of a high concentration, about $5 \times 10^{15}$ impurities/cm$^2$ of the desired impurity, such as arsenic, at a relatively low implantation energy, about 20 keV. The low energy is used so that the impurity is implanted only in the metal silicide layers and does not penetrate into the body 12.

Figure 4:
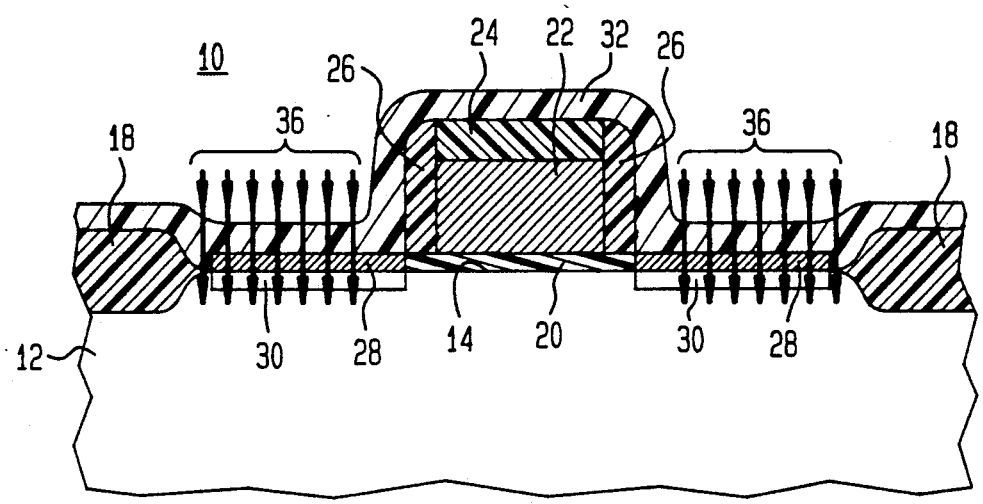

Referring now to FIG. 4, there is shown a cross-sectional view of the transistor 10 during the next steps of the method of the present invention. As indicated by the arrows 36, ions of the same impurity as implanted in the metal silicide layers 30 are then implanted through the metal layer 28 and the metal silicide layers 30 into the region of the body 12 directly beneath the metal silicide layers 30 The implantation is of a low dose of the impurity, such as a dose of $3 \times 10^{14}$ impurities/cm$^2$ of arsenic, a usable range being in the order of $1 \times 10^{14}$–$1 \times 10^{15}$ impurities/cm$^2$. However, the implantation is at a higher energy, typically about 150 keV so as to penetrate through the metal silicide layers 30.

Figure 5:
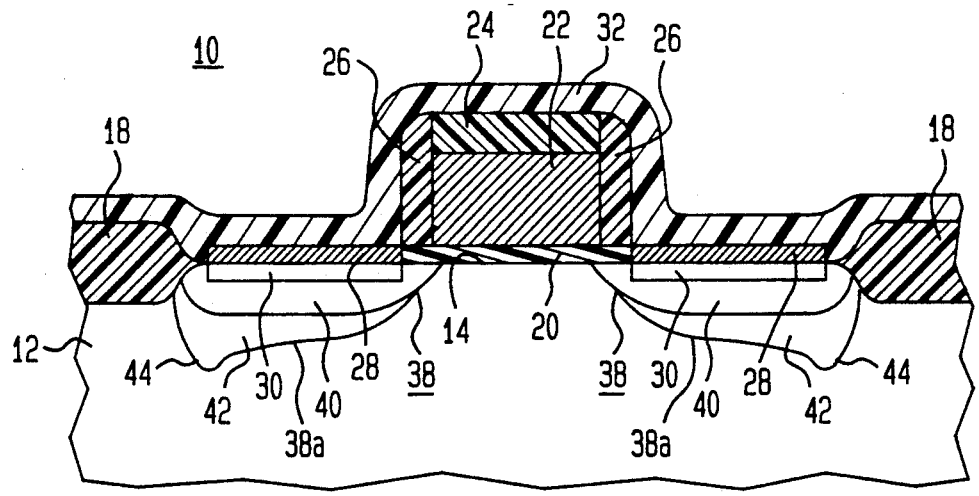

Referring now to FIG. 5, there is shown a cross-sectional view of the transistor 10 showing the final steps of the method of the present invention. The body 12 is then annealed by heating at a temperature of about 900° C. for about 5 minutes to diffuse the impurities from the metal silicide layers 30 into the body 12. This forms the source and drain regions 38 in the body 12. The source and drain regions 38 each has a shallow, highly doped region 40 adjacent the metal silicide layer 30 formed by the impurities from the metal silicide layer 30. Below the highly doped region 40 is a graded conductivity region 42 generated by the low-dose implant. During the annealing of the body 12, the capping layer 32 prevents outdiffusion of the impurities from the metal silicide layers 30 into the atmosphere. The transistor 10 is completed by forming contacts (not shown) to the source and drain regions 38 and the gate 22. For an n-channel transistor 10, the drain and source regions 38 are both of n-type conductivity and the body 12 is of p-type conductivity. Accordingly, each of the drain and source regions 38 forms a p-n junction with the body 12 at an outer edge 38a thereof.

In the method of the present invention, the low dose implantation is low enough to avoid crystal damage in the surface 14 of the body 12, but high enough to achieve junction formation. This suppresses silicide spiking and Schottky diode formation during the step of diffusing the high dosage of the impurities into the metal silicide layers 30 into the body 12. Also, the graded regions 42 of the source/drain regions 38 provides improved junction characteristics. Also, depending on the roughness at the interface of the metal silicide layer 30 and the body 12 and the outdiffusion conditions, the implantation parameters can be optimized independently from the high-dose implantation. In addition, the low dose implantation penetrates not only through the metal silicide layers 30, but also the edge of the isolation regions 18 to form the regions 38 with doped regions 44 under the edges of the isolation regions 18. This improves the leakage characteristics at the perimeter of the junctions 38 as well as reducing area junction leakage and suppressing soft breakdown. Thus, the method of the present invention provides shallow source and drain regions which have improved leakage characteristics and suppressed breakdown characteristics.

Figure 6:
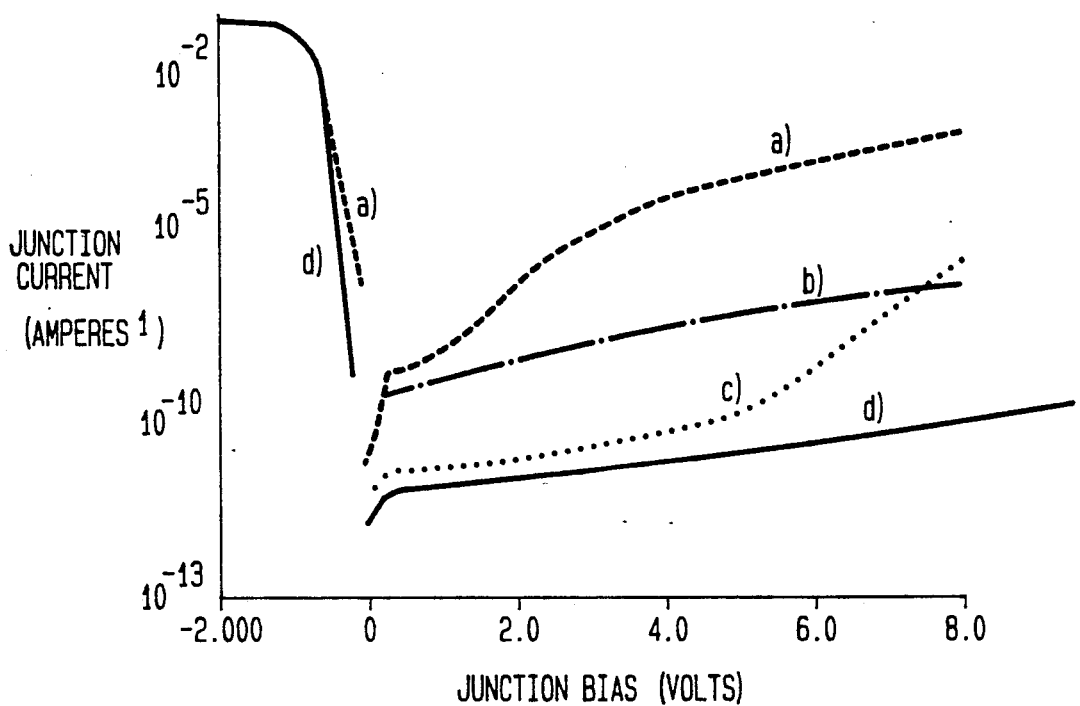
FIG. 6 is a graph showing the junction current vs. junction bias for various transistors made by prior art methods and by the method of the present invention.

Referring now to FIG. 6, there is shown a graph of junction current (Amperes) on the abscissa vs. junction bias (Volts) on the ordinate for a number of transistors fabricated using prior art methods and a transistor fabricated using the method of the present invention. The dash line (a) shows the characteristics for a transistor fabricated by implanting a high dosage of arsenic ($5 \times 10^{15}$ impurities/cm$^2$) at a low energy (20 keV) into a layer of cobalt silicide and then outdiffusing the arsenic into the silicon body at 900° C. for 2 minutes. It can be seen that this transistor has a high leakage current. This results mainly from silicide spiking caused by insufficient outdiffusion.

The dot-dash line (b) shows the characteristics of a transistor fabricated by implanting a full high dosage of arsenic ($5 \times 10^{15}$ impurities/cm$^2$) completely through the metal silicide layer at a high energy (150 keV) and annealing at 900° C. for 2 minutes. This still produces high leakage current as a result of crystal damage in the silicon body created by the ion implantation.

The dot line (c) shows the characteristics of a transistor fabricated in a manner similar to that for line (a) above except that the temperature cycle of the annealing step was increased to 900° C. for 5 minutes followed by 800° C. for 40 minutes. This provides an improvement in the reverse leakage up to about +5 volts, but is characterized by an undesirably high and increasing leakage above +5 volts.

The solid line (d) shows the characteristics of a transistor fabricated in accordance with the present invention as described hereinabove. It can be seen that the reverse junction leakage is reduced by several orders of magnitude over the whole voltage range and there is no evidence of soft breakdown. This the method of the present invention provides a MOS field effect transistor having shallow source and drain regions with improved p-n junction characteristics. In the forward-bias region (0 to −2V), lines b) and c) coincide with lines d) and a), respectively.

It is to be appreciated and understood that the specific embodiments of the invention are merely illustrative of the general principles of the invention. Various modifications may be made consistent with the principles set forth. For example, the isolation regions 18 may be formed by methods other then by oxidizing the surface 14 of the body 12. Still further, the impurity used to form the source and drain junctions 38 may be varied depending on the conductivity type desired. Furthermore, the concentration of the impurity and the energy used for the implantations may be varied somewhat depending on the concentration of the impurity desired and the depth of the implantation.

What is claimed is:

1. A method of forming a shallow junction in a surface of a silicon body of a first conductivity type, comprising the steps of:
    forming a metal silicide layer on said surface of said body;
    doping said metal silicide layer with a first concentration of impurities, wherein said first concentration of impurities are of a second conductivity type which is opposite that of said first conductivity type, and wherein said doping of said metal silicide layer is achieved by ion implantation, said ion implantation being performed at a first energy level whereby said first concentration of impurities are deposited in said metal silicide layer and substantially none of said first concentration of impurities penetrates into said body below said metal silicide layer;
    implanting a second concentration of impurities through said metal silicide layer and into a region of said body below said metal silicide layer, wherein said second concentration of impurities are of said second conductivity type; and
    diffusing said first concentration of impurities from said metal silicide layer into said body, wherein the diffused first concentration of impurities is enclosed within said region containing said second concentration of impurities to form said junction.

2. The method of claim 1 in which said first concentration of impurities is about $5 \times 10^{15}$ impurities/cm$^2$ and said first energy level is about 20 keV.

3. The method of claim 1 in which said second concentration of impurities are implanted through said metal silicide layer into said body by ion implantation.

4. The method of claim 3 in which said second concentration of impurities implanted through said metal silicide layer into said body is less than said first concentration of impurities implanted into said metal silicide layer, the ion implantation of said second concentration of impurities into said body being conducted at a second energy level that is higher than said first energy level.

5. The method of claim 4 in which said second concentration of impurities implanted through said metal silicide layer and into said body is about $3 \times 10^{14}$ impurities/cm$^2$ and said second energy level is about 150 keV.

6. The method of claim 5 in which said first concentration of impurities is about $5 \times 10^{15}$ impurities/cm$^2$ and said first energy level is about 20 keV.

7. The method of claim 4 in which said metal silicide layer is formed by depositing a layer of a metal on said surface of said body and heating said body to a temperature which forms a metal silicide.

8. The method of claim 7 in which said first concentration of impurities are diffused from said metal silicide layer into said body by heating said body.

9. The method of claim 8 in which said body is heated at a temperature of about 900° C. for about 5 minutes to diffuse said first concentration of impurities from said metal silicide layer into said body.

10. A method of making a field effect transistor having shallow source and drain regions comprising the steps of:
    providing a silicon body having a first conductivity type;
    forming on a surface of said body a conductive gate which is insulated from said surface;

forming a metal silicide layer on said surface of said body at points adjacent said gate;

doping each said metal silicide layer with a first concentration of impurities, wherein said first concentration of impurities are of a second conductivity type which is opposite that of said first conductivity type, and wherein said doping of said metal silicide layer is achieved by ion implantation, said ion implantation being performed at a first energy level whereby said first concentration of impurities are deposited in said metal silicide layer and substantially none of said first concentration of impurities penetrates into said body below said metal silicide layer;

implanting a second concentration of impurities through each said metal silicide layer and into a region of said body below each said metal silicide layer, wherein said second concentration of impurities are of said second conductivity type;

diffusing said first concentration of impurities from each of said metal silicide layer into said body, wherein the diffused first concentration of impurities is enclosed within said region containing said second concentration of impurities to form said source and drain regions.

11. The method of claim 10 in which said first concentration of impurities is about $5 \times 10^{15}$ impurities/cm$^2$ and said first energy is about 20 keV.

12. The method of claim 10 in which said second concentration of impurities are implanted through each said metal silicide layer into said body by ion implantation.

13. The method of claim 12 in which said second concentration of impurities implanted through each said metal silicide layer into said body is less than said first concentration of impurities implanted into each said metal silicide layer, the ion implantation of said second concentration of impurities into said body being conducted at a second energy level that is higher than said first energy level.

14. The method of claim 13 in which said second concentration of impurities implanted through each said metal silicide layer and into said body is about $3 \times 10^{14}$ impurities/cm$^2$ and said second energy level is about 150 keV.

15. The method of claim 13 in which each said metal silicide layer is formed by depositing a layer of a metal on said surface of said body and heating said body to a temperature which forms a metal silicide.

16. The method of claim 14 in which said first concentration of impurities are diffused from each said metal silicide layer into said body by heating said body.

17. The method of claim 16 in which said body is heated at a temperature of about 900° C. for about 5 minutes to diffuse said first concentration of impurities from each said metal silicide layer into said body.

18. The method of claim 10 in which prior to forming each said metal silicide layer, sidewall spacers of silicon dioxide are formed against said gate and said metal silicide layer is formed adjacent each of said sidewall spacers.

19. A method of making a field effect transistor having shallow source and drain regions comprising the steps of:

providing a silicon body having a first conductivity type;

forming spaced isolation regions of silicon dioxide on a surface of said body;

forming on at least a portion of said surface of said body between each of said isolation regions a thin gate dielectric layer;

forming on said gate dielectric layer and spaced from each of said isolation regions a gate of conductive polysilicon;

forming a metal silicide layer along said surface of said body between said gate and each of said isolation regions;

doping each said metal silicide layer with a first concentration of impurities, wherein said first concentration of impurities are of a second conductivity type which is opposite that of said first conductivity type, and wherein said doping of said metal silicide layer is achieved by ion implantation, said ion implantation being performed at a first energy level whereby said first concentration of impurities are deposited in said metal silicide layer and substantially none of said first concentration of impurities penetrates into said body below said metal silicide layer;

implanting a second concentration of impurities through each said metal silicide layer and into a region of said body below each said metal silicide layer, wherein said second concentration of impurities are of said second conductivity type; and diffusing said first concentration of impurities from each of said metal silicide layer into said body, wherein the diffused first concentration of impurities is enclosed within said region containing said second concentration of impurities to form said source and drain regions.

20. The method of claim 19 in which said second concentration of impurities are implanted through each said metal silicide layer into said body by ion implantation.

21. The method of claim 20 in which said second concentration of impurities implanted through each said metal silicide layer into said body is less than said first concentration of impurities implanted into each said metal silicide layer, the ion implantation of said second concentration of impurities into said body being conducted at a second energy level that is higher than said first energy level.

22. The method of claim 21 in which said first concentration of impurities is about $5 \times 10^{15}$ impurities/cm$^2$ and said first energy level is about 20 keV, and said second concentration of impurities is about $3 \times 10^{14}$ impurities/cm$^3$ and said second energy level is about 150 keV.

23. The method of claim 20 in which each said metal silicide layer is formed by depositing a layer of a metal on said surface of said body and heating said body to a temperature which forms a metal silicide.

24. The method of claim 23 in which said first concentration of impurities are diffused from each said metal silicide layer into said body by heating said body.

25. The method of claim 24 in which prior to forming each said metal silicide layer a sidewall spacer is formed along each side of said gate, such that each metal silicide layer is formed between one of said sidewall spacers and one of said isolation regions.

26. A field effect transistor having a junction made by the process of claim 1.

27. A field effect transistor having a junction made by the process of claim 10.

28. A field effect transistor having a junction made by the process of claim 19.

* * * * *